(12) United States Patent
Guimarães et al.

(10) Patent No.: US 10,482,206 B1
(45) Date of Patent: Nov. 19, 2019

(54) SYSTEM, METHOD, AND COMPUTER PROGRAM PRODUCT FOR PROVIDING FEEDBACK DURING FORMAL VERIFICATION

(71) Applicant: Cadence Design Systems, Inc., San Jose, CA (US)

(72) Inventors: Breno Rodrigues Guimarães, Belo Horizonte (BR); Caio Araujo Teixeira Campos, Austin, TX (US); Björn Håkan Hjort, Göteborg (SE)

(73) Assignee: Cadence Design Systems, Inc., San Jose, CA (US)

( * ) Notice: Subject to any disclaimer, the term of this patent is extended or adjusted under 35 U.S.C. 154(b) by 149 days.

(21) Appl. No.: 15/615,749

(22) Filed: Jun. 6, 2017

(51) Int. Cl.
*G06F 17/50* (2006.01)
*G06F 11/00* (2006.01)
*G06F 11/36* (2006.01)

(52) U.S. Cl.
CPC .......... *G06F 17/504* (2013.01); *G06F 11/004* (2013.01); *G06F 11/3608* (2013.01)

(58) Field of Classification Search
CPC ............. G06F 17/5081; G06F 17/5068; G06F 17/505; G06F 17/5045; G06F 17/5022; G06F 17/504; G06F 11/004; G06F 11/3608

USPC ............................................ 703/13; 716/111
See application file for complete search history.

(56) References Cited

U.S. PATENT DOCUMENTS

| | | | |
|---|---|---|---|
| 7,895,552 B1 * | 2/2011 | Singhal ................. | G06F 17/504 716/106 |
| 2016/0055272 A1 * | 2/2016 | Chen ..................... | G06F 17/505 716/106 |

* cited by examiner

*Primary Examiner* — Eunhee Kim
(74) *Attorney, Agent, or Firm* — Mark H. Whittenberger, Esq.; Holland & Knight LLP

(57) ABSTRACT

The present disclosure relates to a method for electronic design verification. Embodiments may include receiving, using a processor, at least one electronic design file and a set of inputs from a user, wherein the at least one electronic design file and set of inputs are associated with an electronic design. Embodiments may further include performing formal verification on at least a portion of the electronic design and determining, using a model checker, one or more conflicts associated with a variable during the formal verification. Embodiments may also include translating the one or more conflicts into one or more corresponding signal names and displaying, at a graphical user interface, the corresponding signal names.

14 Claims, 11 Drawing Sheets

SYSTEM, METHOD, AND COMPUTER PROGRAM PRODUCT FOR PROVIDING FEEDBACK DURING FORMAL VERIFICATION

FIELD OF THE INVENTION

The present disclosure relates to electronic design verification, and more specifically, to a method for providing a designer with feedback during formal verification.

DISCUSSION OF THE RELATED ART

Formal verification relies upon a system of constraints to communicate the legal state space to the proof engines. The situation often arises that there is one or more contradictions in the constraints that causes there to be no legal state space. The complexity of the system of constraints, in combination with the design and glue logic, makes it difficult, if not impossible, to precisely locate the root cause of the conflict.

While formal verification methods get more popular and the number of users increase, the ratio of users that comprehend the mechanics involved in model checking engines decreases. With more inexperienced users and more complex systems, it is common to see people stuck waiting for formal engines to give them a conclusive result without any clue of what is causing that engine to spend all that time and computational resources. Experienced users might understand the common sources of complexities for model checking engines and find them manually, however, when facing new and bigger designs they might be unable to determine what causes the engines to take more time.

SUMMARY OF DISCLOSURE

In one or more embodiments of the present disclosure, a computer-implemented method for electronic design verification. The method may include receiving, using a processor, at least one electronic design file and a set of inputs from a user, wherein the at least one electronic design file and set of inputs are associated with an electronic design. The method may further include performing formal verification on at least a portion of the electronic design and determining, using a model checker, one or more conflicts associated with a variable during the formal verification. The method may also include translating the one or more conflicts into one or more corresponding signal names and displaying, at a graphical user interface, the corresponding signal names.

One or more of the following features may be included. In some embodiments, the corresponding signal names may include RTL signal names. Each of the RTL signal names may include a display of a percentage of scores, wherein a highest score indicates a highest number of conflicts. The model checker may be at least one of a Boolean satisfiability ("SAT") checker and a binary decision diagram ("BDD") checker. Displaying may include displaying a heat map associated with a schematic, wherein the heat map corresponds, at least in part, with the highest number of conflicts. Performing and displaying may occur, at least partially, concurrently. Displaying may include displaying RTL signal names and instance names.

In one or more embodiments of the present disclosure a computer-readable storage medium having stored thereon instructions, which when executed by a processor result in one or more operations is provided. Operations may include receiving, using a processor, at least one electronic design file and a set of inputs from a user, wherein the at least one electronic design file and set of inputs are associated with an electronic design. Operations may further include performing formal verification on at least a portion of the electronic design and determining, using a model checker, one or more conflicts associated with a variable during the formal verification. Operations may also include translating the one or more conflicts into one or more corresponding signal names and displaying, at a graphical user interface, the corresponding signal names.

One or more of the following features may be included. In some embodiments, the corresponding signal names may include RTL signal names. Each of the RTL signal names may include a display of a percentage of scores, wherein a highest score indicates a highest number of conflicts. The model checker may be at least one of a Boolean satisfiability ("SAT") checker and a binary decision diagram ("BDD") checker. Displaying may include displaying a heat map associated with a schematic, wherein the heat map corresponds, at least in part, with the highest number of conflicts. Performing and displaying may occur, at least partially, concurrently. Displaying may include displaying RTL signal names and instance names.

In one or more embodiments of the present disclosure, a system for electronic design verification is provided. The system may include one or more processors configured to receive at least one electronic design file and a set of inputs from a user, wherein the at least one electronic design file and set of inputs are associated with an electronic design. The at least one processor further configured to perform formal verification on at least a portion of the electronic design. The at least one processor may be further configured to determine, using a model checker, one or more conflicts associated with a variable during the formal verification. The at least one processor may be further configured to translate the one or more conflicts into one or more corresponding signal names. The at least one processor may be further configured to display, at a graphical user interface, the corresponding signal names.

One or more of the following features may be included. In some embodiments, the corresponding signal names may include RTL signal names. Each of the RTL signal names may include a display of a percentage of scores, wherein a highest score indicates a highest number of conflicts. The model checker may be at least one of a Boolean satisfiability ("SAT") checker and a binary decision diagram ("BDD") checker. Displaying may include displaying a heat map associated with a schematic, wherein the heat map corresponds, at least in part, with the highest number of conflicts. Performing and displaying may occur, at least partially, concurrently. Displaying may include displaying RTL signal names and instance names.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
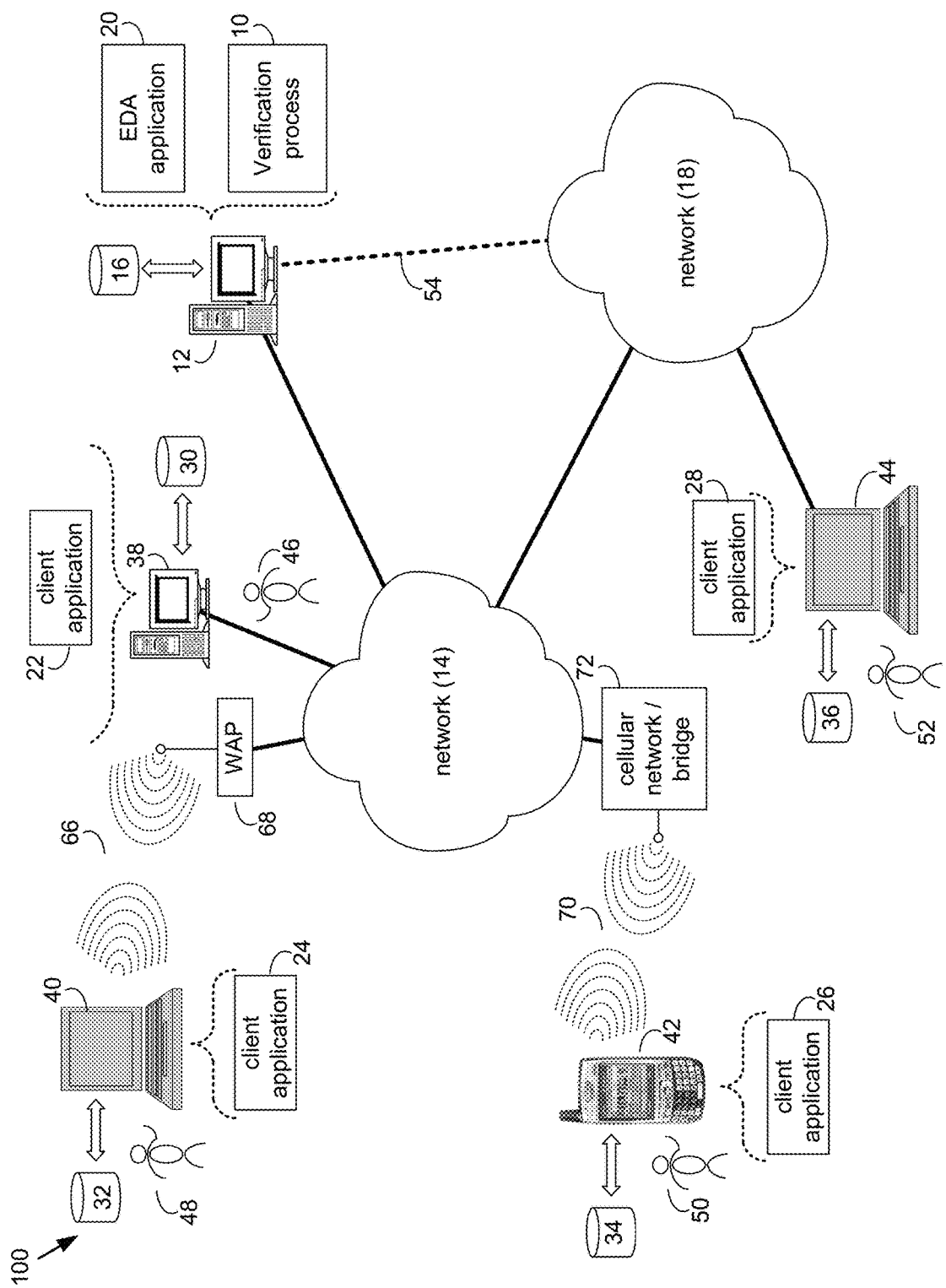
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a verification process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, verification process 10 may reside on and be executed, in whole or in part, by a client electronic device, such as a personal computer, notebook computer, personal digital assistant, or the like.

The instruction sets and subroutines of verification process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization and/or verification.

Verification process 10 may be a stand alone application, or may be an applet/application/script that may interact with and/or be executed within EDA application 20. In addition/as an alternative to being a server-side process, verification process 10 may be a client-side process (not shown) that may reside on a client electronic device (described below) and may interact with an EDA client application (e.g., one or more of EDA client applications 22, 24, 26, 28). Further, verification process 10 may be a hybrid server-side/client-side process that may interact with EDA application 20 and an EDA client application (e.g., one or more of client applications 22, 24, 26, 28). As such, verification process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize verification process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
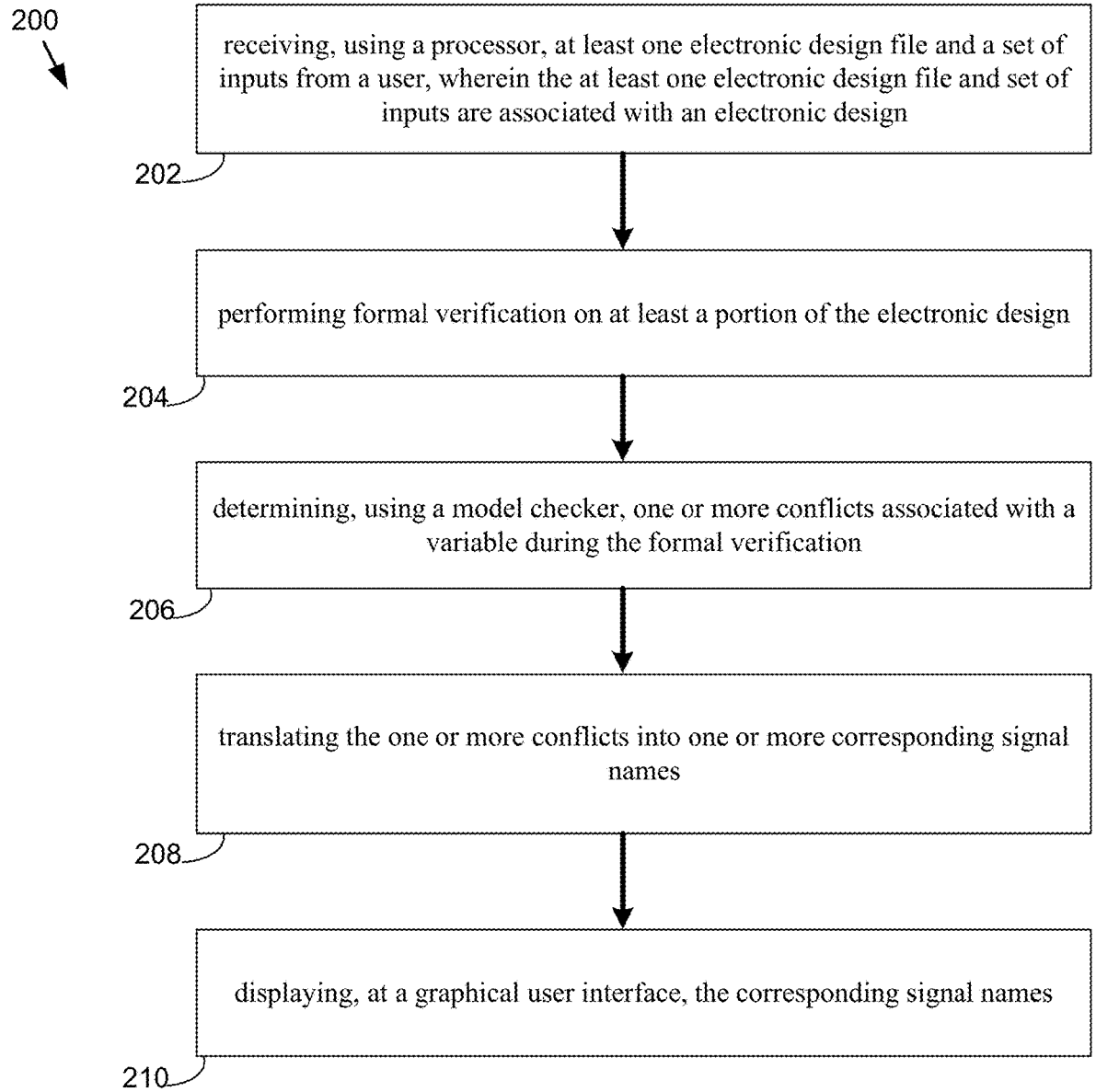
FIG. 2 is a flowchart depicting operations consistent with the verification process in accordance with an embodiment of the present disclosure.

Referring now to FIG. 2, an exemplary flowchart 200 depicting operations consistent with verification process 10 is provided. Operations may include receiving (202), using a processor, at least one electronic design file and a set of inputs from a user, wherein the at least one electronic design file and set of inputs are associated with an electronic design. Embodiments may further include performing (204) formal verification on at least a portion of the electronic design and determining (206), using a model checker, one or more conflicts associated with a variable during the formal verification. Embodiments may also include translating (208) the one or more conflicts into one or more corresponding signal names and displaying (210), at a graphical user interface, the corresponding signal names.

As discussed above, formal verification relies upon a system of constraints to communicate the legal state space to the proof engines. The situation often arises that there is one or more contradictions in the constraints that causes there to be no legal state space. The complexity of the system of constraints, in combination with the design and glue logic, makes it difficult, if not impossible, to precisely locate the root cause of the conflict.

As discussed above, while formal verification methods get more popular and the number of users increase, the ratio of users that comprehend the mechanics involved in model checking engines decreases. With more inexperienced users and more complex systems, it is common to see people stuck waiting for formal engines to give them a conclusive result without any clue of what is causing that engine to spend all that time and computational resources. Experienced users might know better some common sources of complexities for model checking engines and find them manually, but when facing new and bigger designs they might be unable to determine what causes the engines to take more time.

Embodiments of verification process 10 included herein may be configured to instrument formal engines in a way that the low level structures used by the model checkers can be mapped back to the level that is comprehensible to the user, such as, register transfer level ("RTL"), schematic, graph, etc., therefore allowing the user to understand the sources of complexities. In some embodiments, once the sources of complexities are understood, abstractions, remodeling, helper assertions, etc., may be applied (either automatically or manually), potentially improving the ability to get conclusive results within the given resource limits. Also, with the sources of complexity more well defined, a user might chose to focus on problems that avoid or side step the these areas.

Some existing implementations may try to identify problematic components through structural analysis of the design under verification, or by means of heuristics/rules-of-thumb (e.g., multipliers, ecc-circuits, and/or components that have previously been sources of high complexity). The conventional strategies may point to structures that might not be harmful to the analysis of the specific problem at hand, and might miss other structures if they are not coded in a well-known pattern/style. If a model checker is taking too long to prove or disprove a property, it is currently difficult to know why and therefore it is not possible to change modeling, the property, or environment setup to improve the model checker performance.

Accordingly, embodiments of verification process 10 may be configured to gather profiling data from formal engines (e.g., model checkers) and provide a mechanism to translate the data from the low level structures used by the model checkers back to a user comprehensive level, examples of which may include, but are not limited to, RTL, schematic, graph, and other forms.

Additionally and/or alternatively, embodiments of verification process 10 may be configured to provide an iterative flow in which structures identified as harmful for the formal engine performance may be abstracted or remodeled in a semi-automatic (e.g., with user interaction) or automatic way, to improve the performance of a formal engines.

In some embodiments, formal verification, may be initiated by feeding a formal tool with the design files described in a HDL language (e.g., Verilog, VHDL, etc.). IN operation, a user may proceed to inform the formal tool about properties to be verified and constraints for the verification, some of which may include, but are not limited to, clock signals, reset signals, assumptions. Finally, the formal tool may initiate the analysis of the set of inputs to determine if properties can be violated or not. Users may also inform the formal tool of logic that can be discarded or remodeled for the analysis of the properties. This may be frequently used by experienced users to improve the performance of the formal engines. In existing systems, formal engines may take unpredictable time to reach the result for the properties, which is a major source for frustration for users of formal tool.

In some embodiments, a formal engine profiler may be provided. The formal tool may receive a set of inputs from the user, and compile the logic into a format that a Boolean satisfiability ("SAT") checker, binary decision diagram ("BDD") checker, etc. may work with. As used herein the phrase "model checker" may deal with the reasoning at the level of temporal behavior. In other words, why the properties can't be violated in the first, second, third or even in any cycle. In doing this computation they can use a Boolean satisfiability ("SAT") checker or binary decision diagram ("BDD") package (e.g., a data structure and an algorithm).

Figure 3:
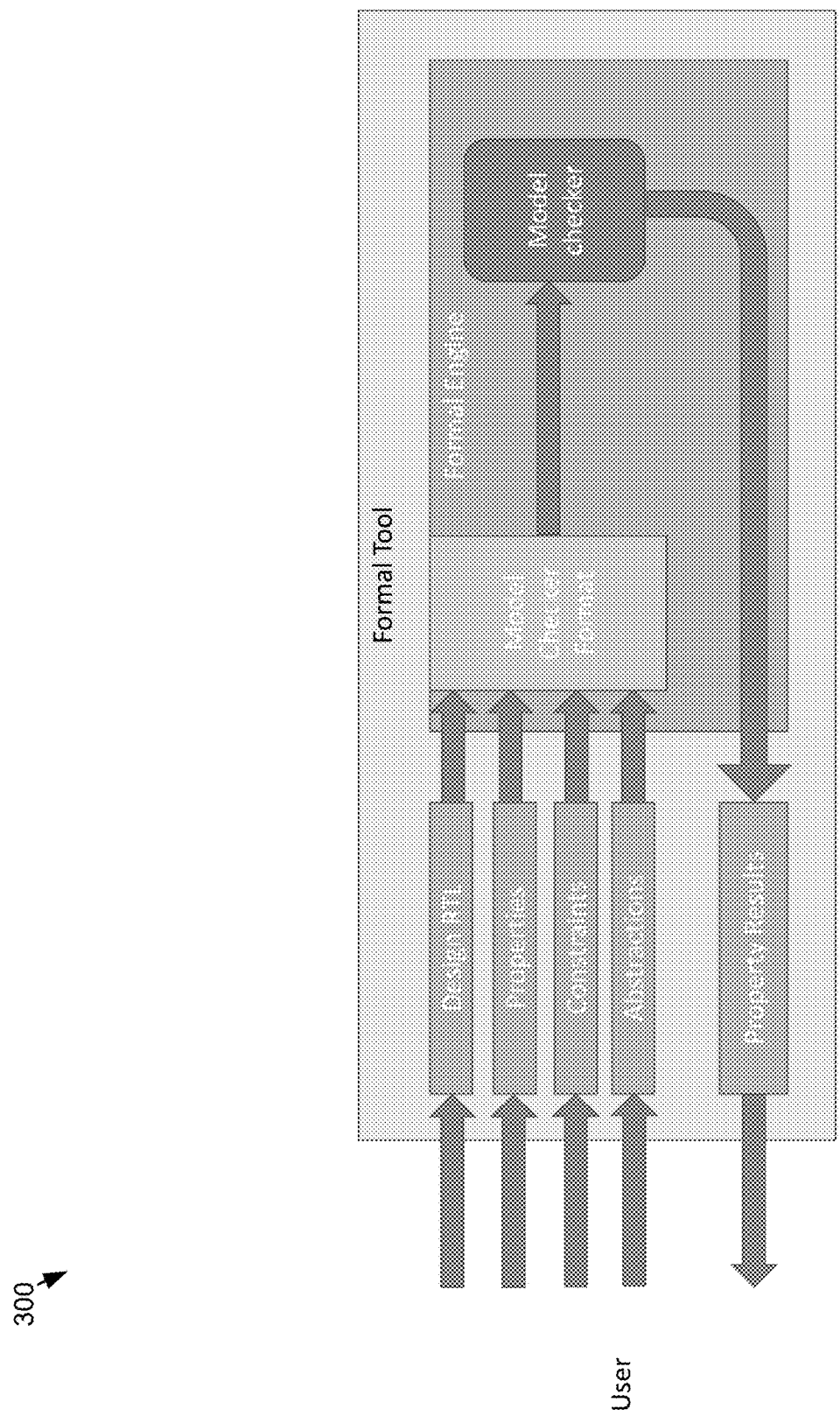
FIG. 3 is a diagram depicting an embodiment in accordance with the present disclosure.

Referring also to FIG. 3, a diagram 300 showing an embodiment consistent with verification process 10 is provided. Formal tools may have more than one representation of the logic to be verified. Richer more complex representations are progressively lowered into less complex and more regular structures. In some tools, for example, the HDL modeling goes through the following representations:

register transfer level ("RTL") text, statically elaborated RTL, hierarchical netlist, flattened netlist, word-level logic expressions, bit-level logic gates, and -inverter graph ("AIG") model, which may be finally translated to a conjunctive normal form ("CNF") formula which may be used by the SAT solver.

Figure 4:
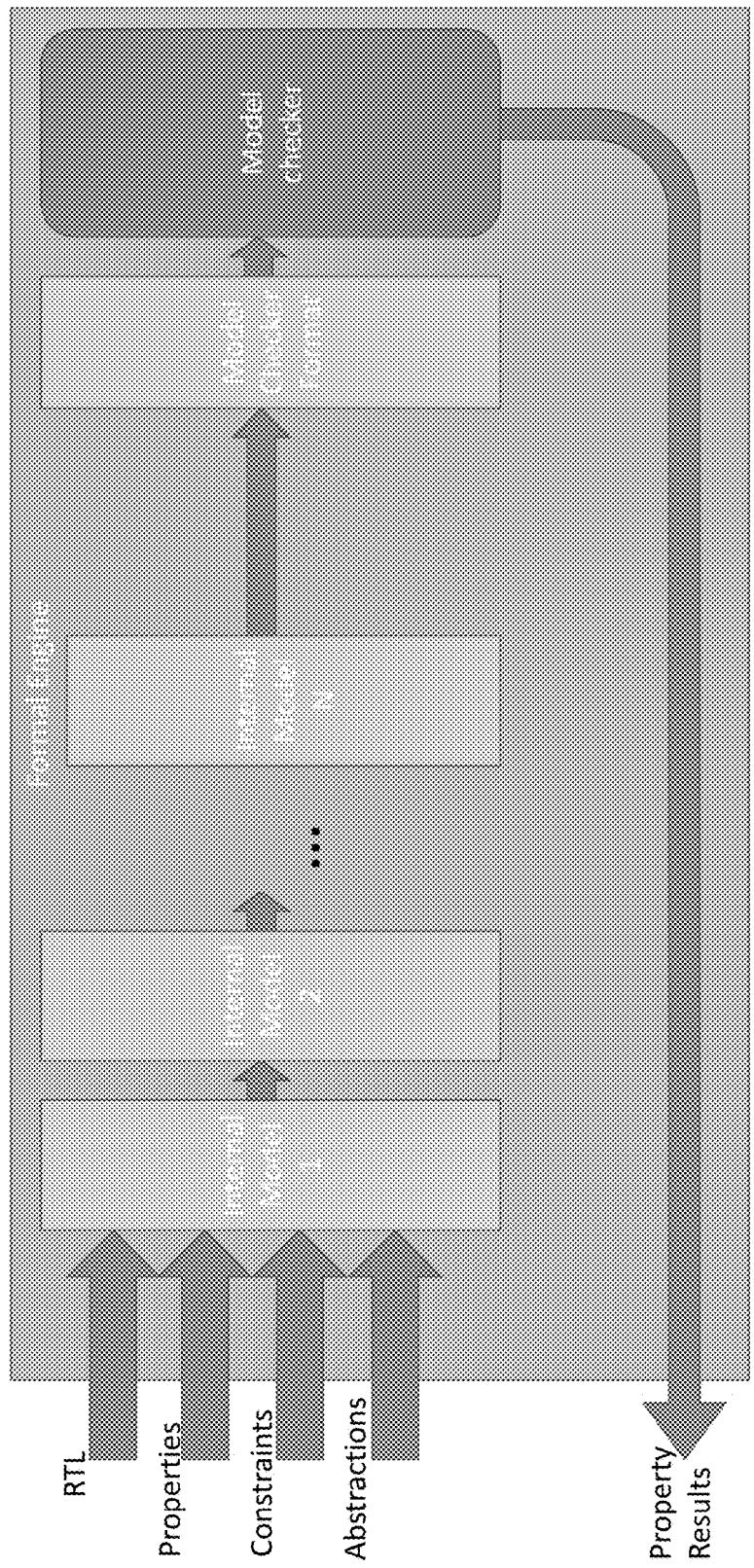
FIG. 4 is a diagram depicting an embodiment in accordance with the present disclosure.

In some embodiments, and referring also to FIG. 4 and diagram 400, a formula in CNF may correspond to a conjunction of clauses (or a single clause). A clause may be a disjunction of literals (or a single literal). A literal may be a variable or its negation. Most modern SAT solvers use CNF as their representation. In operation, a user may define metrics that measure on variables or clauses. Possible candidates may include, but are not limited to, a number of times a variable has been assigned a value in the SAT solvers search, the number of times a variable has been inspected by the SAT solver, the number of times a variable (or clauses) has participated in a conflict, the number of times a variable has been resolved on in conflict clause deduction, the number of times a clause has participated in the resolution of a conflict clause, the number of times a clause has caused a propagation in Boolean Constraint Propagation ("BCP"), the number of times a variable has appeared in derived conflict clauses. Other metrics can also work, or provide different information. For other reasoning systems, like BDD, other metrics could be defined to measure the complexity of their execution.

In some embodiments, verification process 10 may be configured to score how many time a clause is involved in a conflict during the SAT solver execution. A conflict may be a group of clauses that are evaluated to False in the current solution attempt of the solver.

Figure 5:
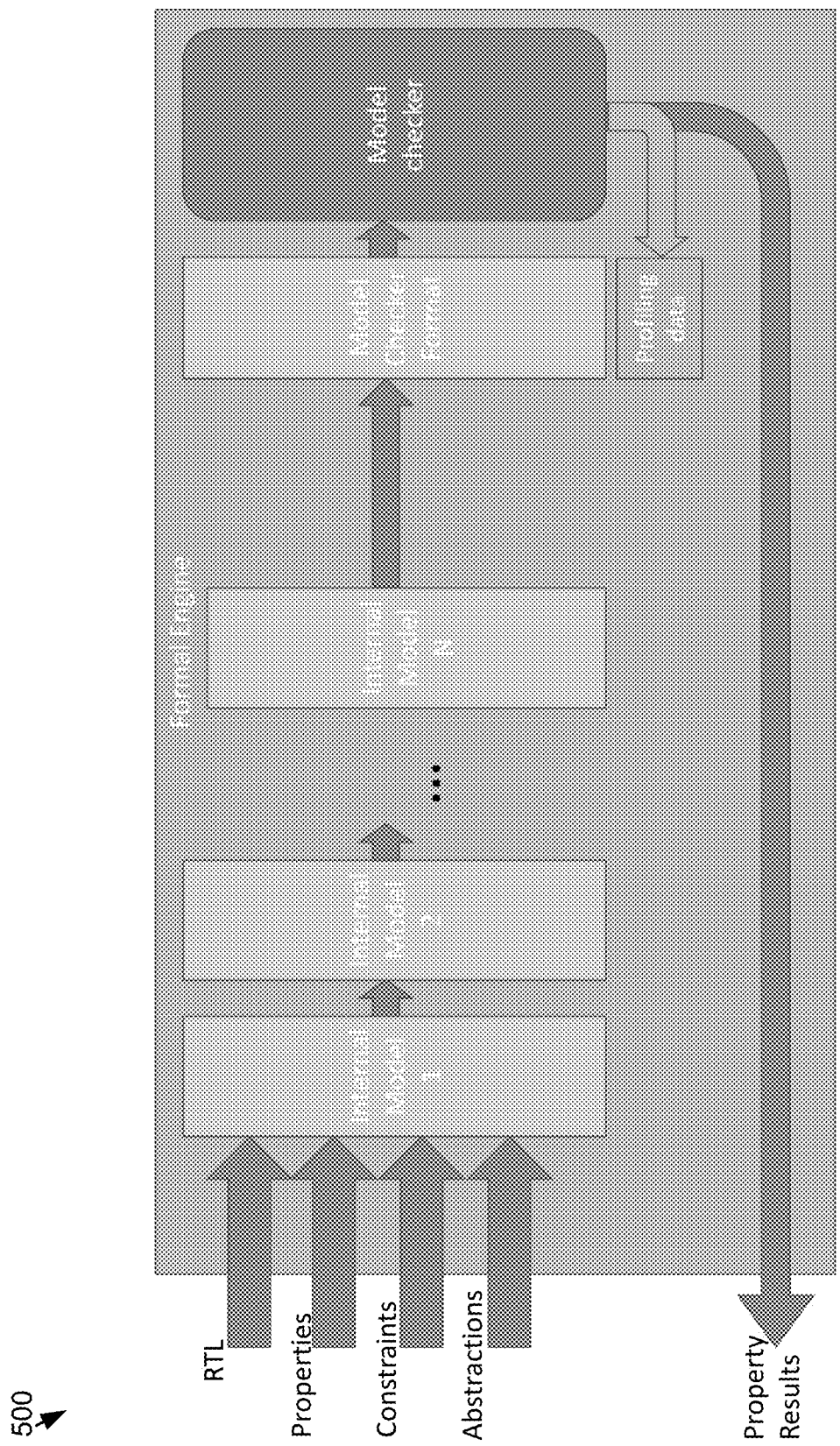
FIG. 5 is a diagram depicting an embodiment in accordance with the present disclosure.

Referring also to FIG. 5 and diagram 500, it should be noted that the profiling data may only be valuable if the user can comprehend it. As such, during the transformation between the different internal models, verification process 10 may also add a map to enable the conversion of structures in the opposite direction. This may be used to translate proof results, etc. For the profiling purpose, these maps must be precise in order to enable the translation of fine-grained profiling data.

Figure 6:
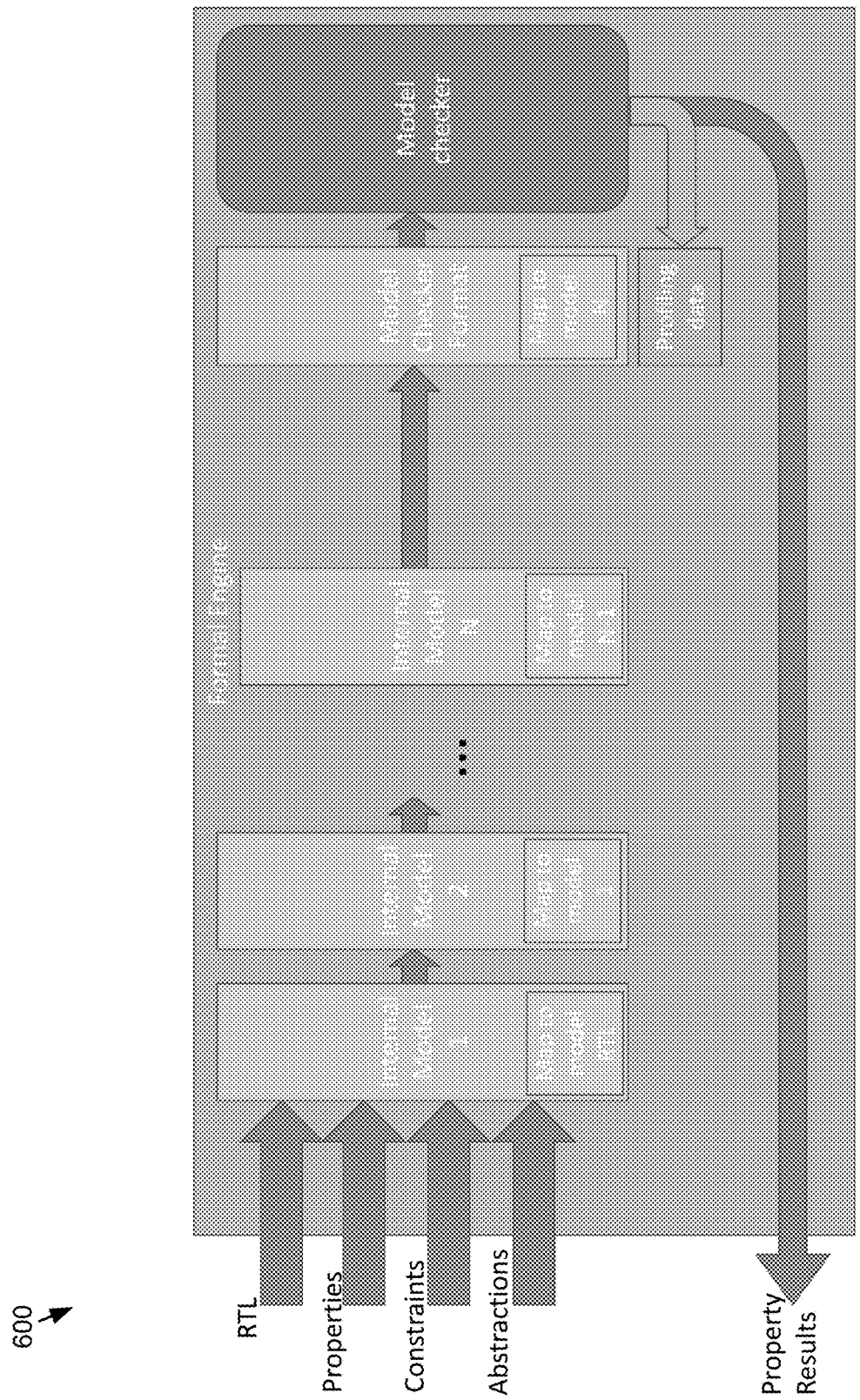
FIG. 6 is a diagram depicting an embodiment in accordance with the present disclosure.

Referring also to FIG. 6, a diagram 600 consistent with embodiments of verification process 10 is provided. Diagram 600 depicts a formal engine including a number of internal models, a model checker format, and a model checker. As is shown in the Figure each internal model and model checker format may include one or more maps. With these components, verification process 10 may allow for the translation of the profiling data into a user comprehensible model.

Figure 7:
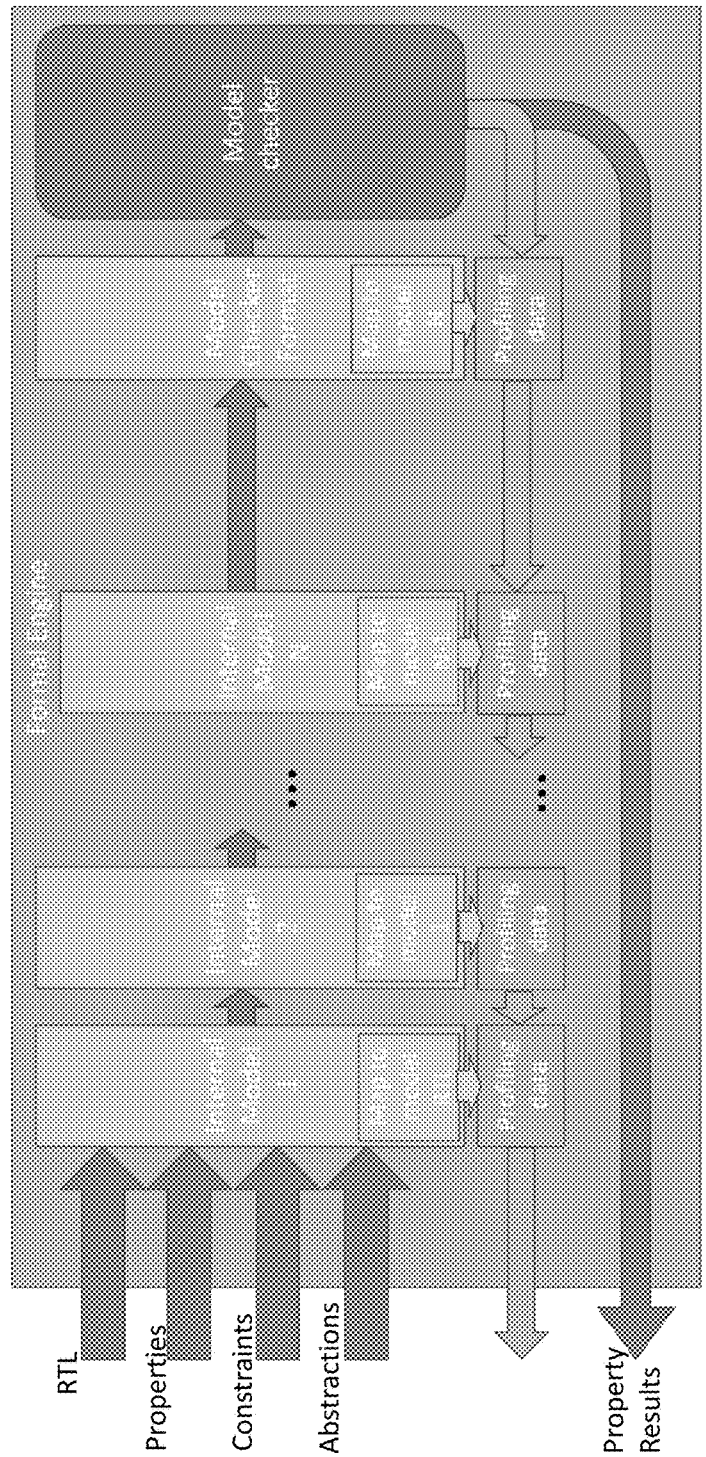
FIG. 7 is a diagram depicting an embodiment in accordance with the present disclosure.

Referring also to FIG. 7, a diagram 700 consistent with embodiments of verification process 10 is provided. Diagram 700 depicts a formal engine including a number of internal models, a model checker format, and a model checker. As is shown in the Figure each internal model and model checker format may include one or more maps and may receive profiling data from the model checker. As such, verification process 10 may be configured to translate the profiling data into RTL signal names, and the percentage of the scores each signal received. Here, the diagram provides the user with information regarding what the model checker is doing and what RTL generated structures the model checker is working upon.

Figure 8:
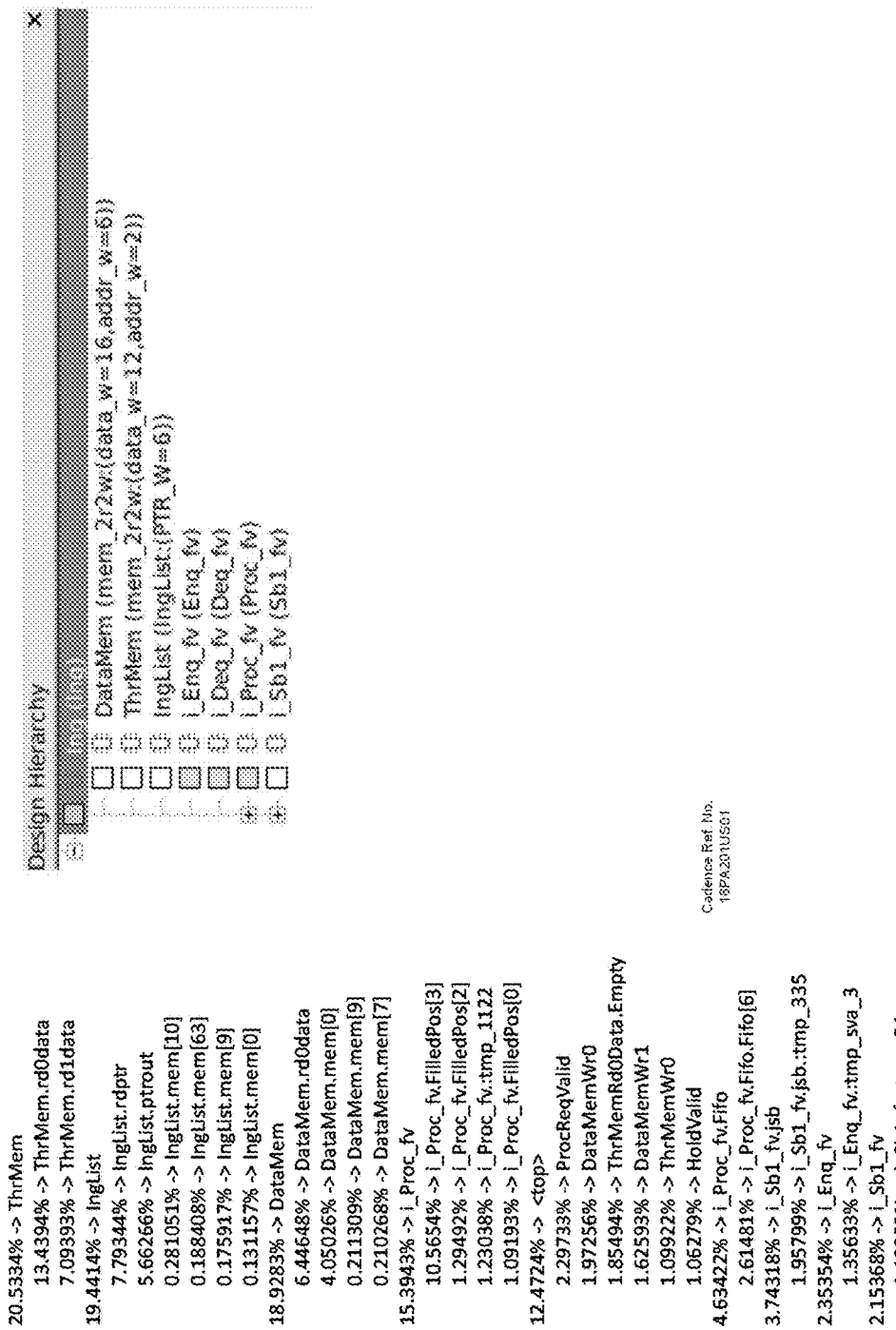
FIG. 8 is a diagram depicting an embodiment in accordance with the present disclosure.

Referring also to FIG. 8, an embodiment displaying a possible graphical user interface 800 and its corresponding display is provided. In this way, verification process 10 may be configured to display the profiling data (e.g., shown on the left hand side) and a display of one or more instance tree panels for that particular electronic design.

In some embodiments, verification process 10 may be configured to classify signals by their design instance, and show instances with highest effort on the top. It may also show the signals that may be taking a larger percentage of the scores within each instance. In this particular example, the prototype points to linked lists and memory instances, which are known to slow down model checkers.

Figure 9:
FIG. 9 is a diagram depicting an embodiment in accordance with the present disclosure.
Figure 9:
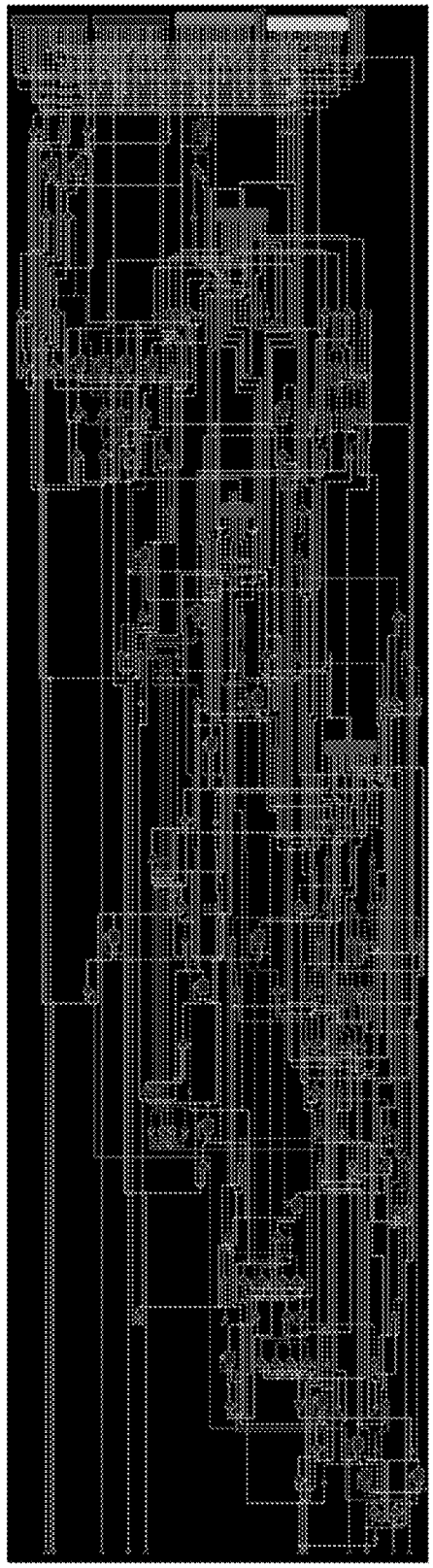

Additionally and/or alternatively, in some embodiments various other techniques could be used to indicate where the engines are spending time. Some of these may include, but are not limited to, a heatmap on top of a schematic (as shown in FIG. 9) as a graph, etc.

Figure 10:
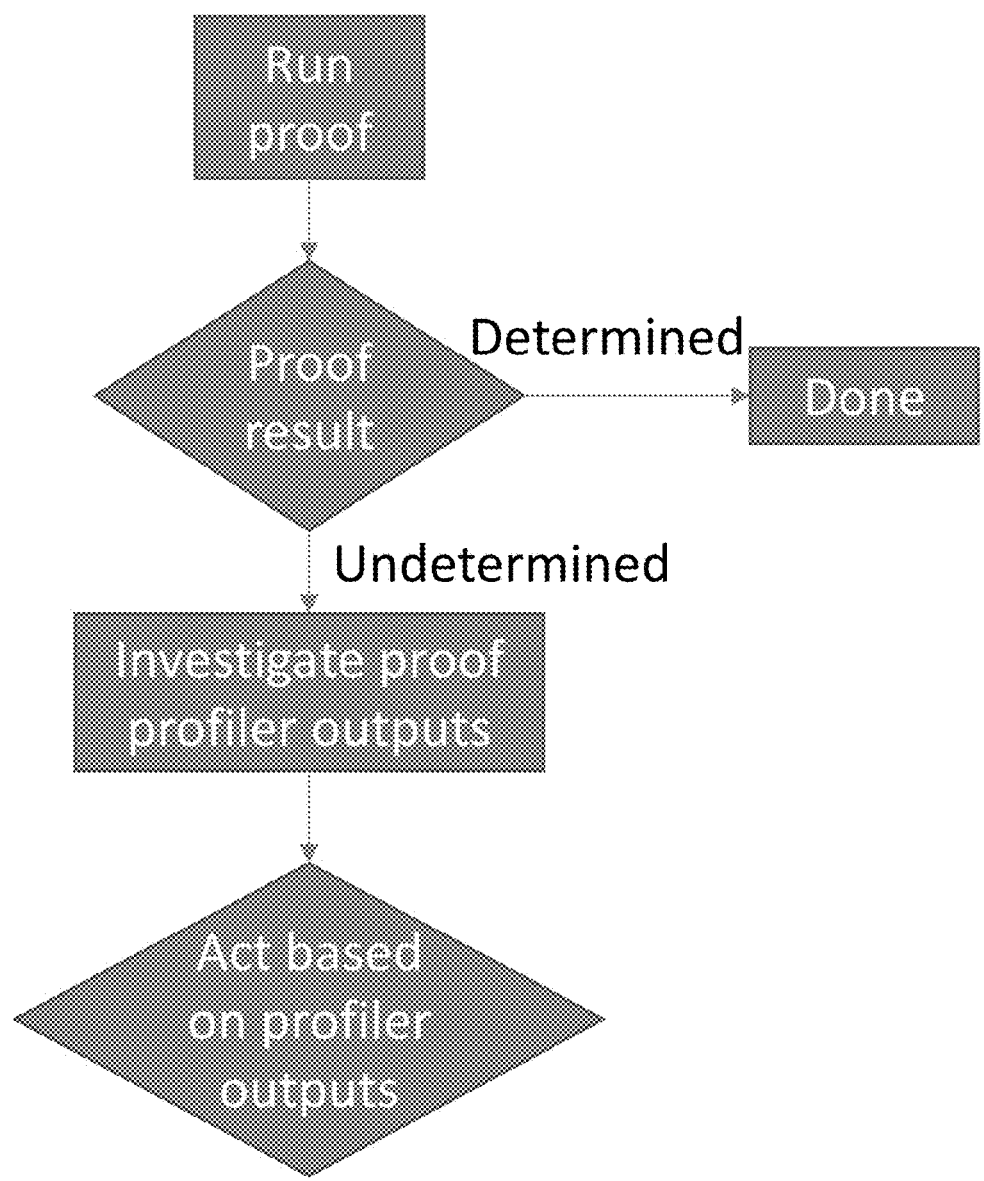
FIG. 10 is a flowchart depicting operations consistent with the verification process in accordance with an embodiment of the present disclosure.
Figure 11:
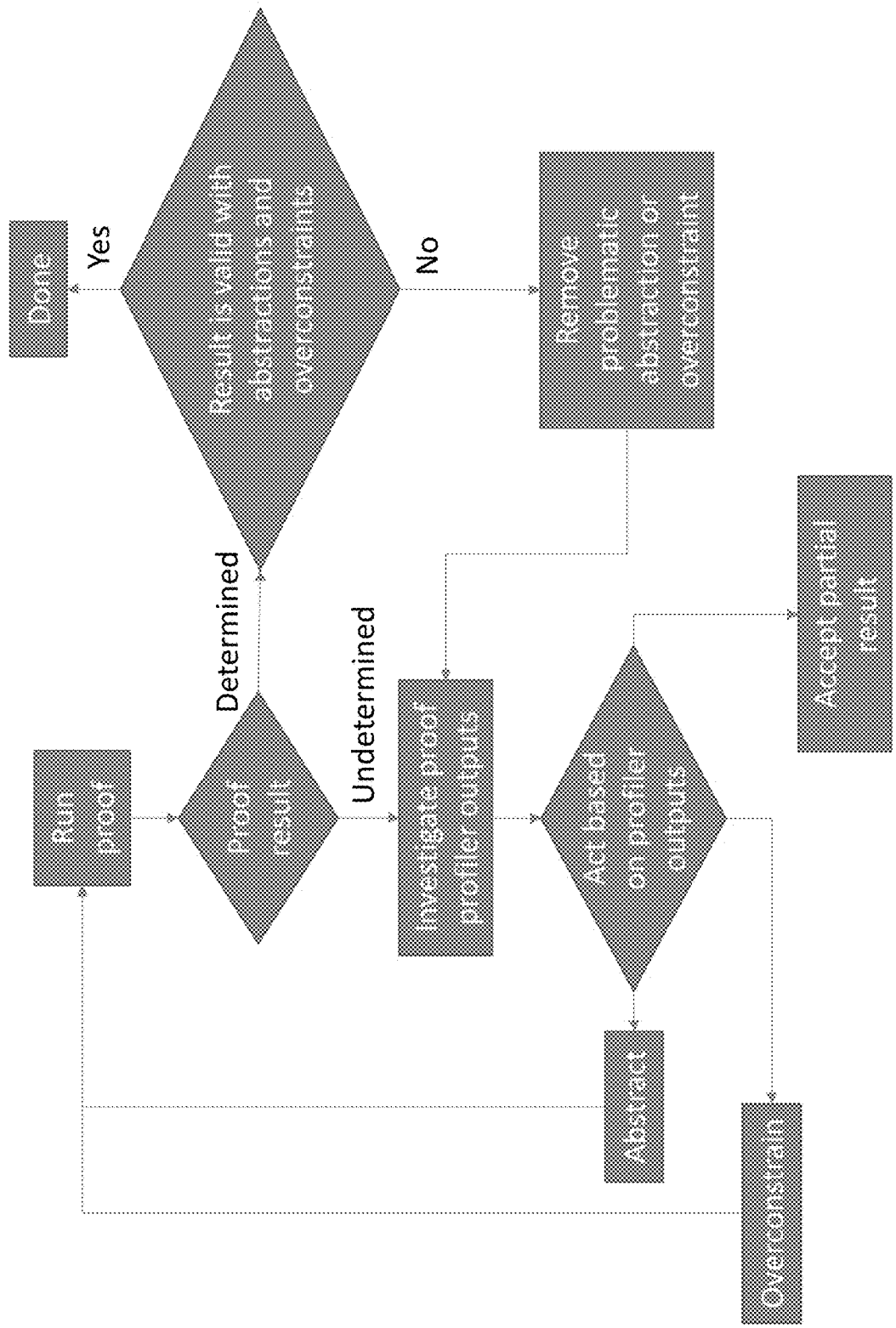
FIG. 11 is a flowchart depicting operations consistent with the verification process in accordance with an embodiment of the present disclosure.

Referring also to FIGS. 10-11, embodiments of verification process 10 that show operations for enhancing the performance of the formal engine are provided. As described above, the time necessary to reach the result for properties may be unpredictable. Frequently, users wait a certain amount of time until they feel that they need to take an action or even stop and accept the partial result obtained until that moment. With the information provided by the formal engine profiler one could run an interactive flow taking these actions faster and more efficiently, since they will likely be related to the real sources of complexities.

For example, the user could run a proof until a time limit is reached. If the target properties are determined his or her task may be completed. However, if they are undetermined properties he or she may want to look at the outputs of the proof profiler. That result indicates where engines are spending more time, thus the user could take a more informed action.

As shown in FIG. 10, the user may look at the profiler output and decide that a partial result, such as a bounded proof, is enough and that the effort to manage the complexity pointed by the profiler may not worth to get a complete result. If the user decides to pursue a complete result, the verification environment may be modified, either manually or automatically, adding, for example, abstractions (e.g., remove the associated logic, remodel it, reduce the size of related structures, etc.) or overconstraints (e.g., restrict the behavior of the design forcing the engines to explore other states of the model being checked), before a new proof is run. In some embodiments, if the modified environment yields a determined property, it needs to be determined whether the conclusive result is still valid under the original environment. In the event of a valid conclusive result, the task may be complete, but in the event where the changes resulted in an invalid behavior they need to be removed. If the changes are removed, the previous profiler outputs may be checked again in order to come up with different changes, restarting the process of changing the environment, running a proof and investigating the proof results or profiler outputs.

As shown in FIG. 11, an expansion of this flow could include applying multiple changes at a time, either in a single proof job or multiple that could be processed in parallel. For example, in some embodiments, an engine could add an abstraction and restart working on the problem while another instance adds an overconstraint and processes the problem at the same time. Since there are multiple possibilities, these may be run in parallel or sequentially, individually or combined, etc. In some embodiments, the system may be configured to apply multiple changes at a time (e.g., in a sequential way, but not in parallel, etc.).

In some embodiments, based on the profiler output, an action may be taken (e.g., either manually by the user and/or automatically/semi-automatically by the tool). There are multiple possibilities for these actions, some of which may include, but are not limited to, adding an abstraction or overconstraint. Multiple abstractions and multiple overconstraints may also be added at the same time as well. Additionally and/or alternatively, more and more abstractions or overconstraints can be added incrementally as the profiler output may get refined through proof iterations. Given this many possibilities, any verification environment created by a combination of actions could potentially be executed individually and in parallel. Once a proof result is obtained, it is important to check its validity under the current abstractions and overconstraints. If invalid, the offending abstractions and constraints need to be reviewed and may be removed.

Existing techniques use structural analysis or heuristics to predict sources of complexities on the model checker. In contrast, embodiments of verification process 10 do not predict, but extract this information from the formal analysis itself, leading to more accurate identification of sources of complexities. The current approaches try to speculate that some structures on the design will be harmful for the formal engine performance, and users try to remodel these structures hoping that it will improve the engine performance.

Accordingly, verification process 10 may provide a performance improvement in that it increases the speed with which a formal engine may perform formal verification.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design verification comprising:
   receiving, using a processor, at least one electronic design file and a set of inputs from a user, wherein the at least one electronic design file and set of inputs are associated with an electronic design;
   performing formal verification on at least a portion of the electronic design;
   determining, using a model checker, one or more conflicts associated with a variable during the formal verification;
   translating the one or more conflicts into one or more corresponding signal names; and
   displaying, at a graphical user interface, the corresponding signal names, wherein the corresponding signal names include RTL signal names and wherein each of the RTL signal names includes a display of a percentage of scores, wherein a highest score indicates a highest number of conflicts.

2. The computer-implemented method of claim 1, wherein the model checker is at least one of a Boolean satisfiability ("SAT") checker and a binary decision diagram ("BDD") checker.

3. The computer-implemented method of claim 1, wherein displaying further includes displaying a heat map associated with a schematic, wherein the heat map corresponds, at least in part, with the highest number of conflicts.

4. The computer-implemented method of claim 1, wherein performing and displaying occur, at least partially, concurrently.

5. The computer-implemented method of claim 2, wherein displaying includes displaying RTL signal names and instance names.

6. A non-transitory computer-readable storage medium for electronic design verification, the computer-readable storage medium having stored thereon instructions that when executed by a machine result in one or more operations, the operations comprising:
   receiving, using a processor, at least one electronic design file and a set of inputs from a user, wherein the at least one electronic design file and set of inputs are associated with an electronic design;
   performing formal verification on at least a portion of the electronic design;
   determining, using a model checker, one or more conflicts associated with a variable during the formal verification;
   translating the one or more conflicts into one or more corresponding signal names; and
   displaying, at a graphical user interface, the corresponding signal names, wherein the corresponding signal names include RTL signal names and wherein each of the RTL signal names includes a display of a percentage of scores, wherein a highest score indicates a highest number of conflicts.

7. The non-transitory computer-readable storage medium of claim 6, wherein the model checker is at least one of a Boolean satisfiability ("SAT") checker and a binary decision diagram ("BDD") checker.

8. The non-transitory computer-readable storage medium of claim 6, wherein displaying further includes displaying a heat map associated with a schematic, wherein the heat map corresponds, at least in part, with the highest number of conflicts.

9. The non-transitory computer-readable storage medium of claim 6, wherein performing and displaying occur, at least partially, concurrently.

10. The non-transitory computer-readable storage medium of claim 9, wherein displaying includes displaying RTL signal names and instance names.

11. A system for electronic design verification comprising:
    a computing device having at least one processor configured to receive at least one electronic design file and a set of inputs from a user, wherein the at least one electronic design file and set of inputs are associated with an electronic design, the at least one processor further configured to perform formal verification on at least a portion of the electronic design, the at least one processor further configured to determine, using a model checker, one or more conflicts associated with a variable during the formal verification, the at least one processor further configured to translate the one or more conflicts into one or more corresponding signal names, the at least one processor further configured to display, at a graphical user interface, the corresponding signal names wherein the corresponding signal names include RTL signal names and wherein each of the RTL signal names includes a display of a percentage of scores, wherein a highest score indicates a highest number of conflicts.

12. The system of claim 11, wherein the model checker is at least one of a Boolean satisfiability ("SAT") checker and a binary decision diagram ("BDD") checker.

13. The system of claim 11, wherein displaying further includes displaying a heat map associated with a schematic, wherein the heat map corresponds, at least in part, with the highest number of conflicts.

14. The system of claim 11, wherein performing and displaying occur, at least partially, concurrently.

\* \* \* \* \*